(12) United States Patent
Fasano et al.

(10) Patent No.: US 6,194,085 B1
(45) Date of Patent: Feb. 27, 2001

(54) OPTICAL COLOR TRACER IDENTIFIER IN METAL PASTE THAT BLEED TO GREENSHEET

(75) Inventors: Benjamin V. Fasano, New Windsor; James N. Humenik, Lagrangeville; David C. Long, Wappingers Falls; Cynthia J. Calli, Newburgh, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 08/936,030

(22) Filed: Sep. 27, 1997

(51) Int. Cl.[7] .................................................. H01L 29/12
(52) U.S. Cl. ........................ 428/620; 428/195; 428/621; 428/624
(58) Field of Search ....................... 427/96, 97; 428/621, 428/624, 626, 639, 647, 620, 195

(56) References Cited

U.S. PATENT DOCUMENTS

| | | |
|---|---|---|
| 4,137,369 * | 1/1979 | Chalkin . |
| 4,137,628 | 2/1979 | Suzuki . |
| 4,576,735 | 3/1986 | Kuroki et al. . |
| 4,576,736 | 3/1986 | Harmuth . |
| 4,733,039 * | 3/1988 | Schnable et al. . |
| 4,803,110 | 2/1989 | Ahn et al. . |
| 4,902,371 | 2/1990 | Andris et al. . |
| 4,919,970 * | 4/1990 | Hoebener et al. . |
| 5,047,368 | 9/1991 | Schnitker et al. . |

\* cited by examiner

Primary Examiner—Merrick Dixon
(74) Attorney, Agent, or Firm—DeLio & Peterson LLC; John J. Tomaszewski; Ira D. Blecker

(57) ABSTRACT

A coating material used in the fabrication of electronic components such as a metallized paste is provided comprising a material to be coated on the electronic component substrate and an identifying component which identifying component can be identified and which identifying component identifies the coating material. Optical dyes visible to the eye can be used as the identifying component with a preferred dye being a UV fluorescent dye which is colorless under visible light and visible under UV light. A process for making an electronic component using the coating materials of the invention and electronic components made using the coating material are also provided.

13 Claims, 1 Drawing Sheet

OPTICAL COLOR TRACER IDENTIFIER IN METAL PASTE THAT BLEED TO GREENSHEET

BACKGROUND OF THE INVENTION

1. Field of the Invention

The present invention relates to patterning processes using materials such as a conductive metal paste and a solder flux in the fabrication of an article such as an electronic component and, more particularly, to screening or masking processes for applying coatings of materials for forming patterns on layers of a multilayer ceramic (MLC) circuit structure whereby the coated material and/or electronic component may be identified to verify if the proper coating material and/or the proper electronic component was employed.

2. Description of Related Art

Forming patterns of a material on a surface by extruding or forcing the material through, for example, a screen or mask, such as a perforated sheet, has been applied in many fields such as printing and engraving, graphic arts and manufacturing processes, particularly in the electronic industry. The ability to form a plurality of conductors simultaneously on the surface of a substrate permits an inexpensive alternative wiring technique which also results in a compact efficient wiring structure. The terms mask and screen will be used interchangeably herein to indicate coating procedures.

The scale of integration in integrated circuits has steadily increased over the years, resulting in integrated circuits with extreme complexity and capable of very comprehensive functions. A particularly successful type of structure with such devices has been developed which uses a plurality of layers of glass, ceramic or other insulative material with conductors formed on the respective surfaces and in through-holes (vias) in the layers. These components are typically termed multilayer ceramics (MLC) and since circuits constructed in this way are three dimensional, a high degree of complexity is possible.

In such structures, the conductors are usually formed by applying the desired pattern on the substrate using a conductive paste. The conductive paste pattern is usually formed by extruding the paste, which is usually highly viscous, through a stencil or mask such as a perforated sheet by passing an extrusion nozzle over the mask located on the ceramic layer or greensheet of the MLC.

In general, a multilayer ceramic semiconductor package (MLC) is formed by stacking and bonding together flexible paper-like sheets commonly referred to as ceramic greensheets. Greensheet segments of desired size and configuration are punched to provide via holes and, by a screen printing technique, a conductive paste fills the via holes and/or a conductive circuit pattern is applied to the face of the greensheet as required. Such patterned greensheets, after screening, are assembled in a stack, pressed and subsequently sintered in an oven at a relatively high temperature. Upon sintering, the solvent, vehicle, and binder material used to form the greensheet are burned off providing a rigid unitary ceramic body having interior interconnected conductive patterns. Critical to the manufacturing process is the screening operation since the ceramic greensheets are relatively fragile, their thickness generally on the order of 1 to 20 mil and their surface area is relatively large compared to their thickness.

There are many types of MLC conductive pastes which are screened onto the greensheet. An electronic conductive molybdenum paste is disclosed in U.S. Pat. No. 4,576,735, which patent is hereby incorporated by reference. In general, a metallic paste such as a molybdenum paste comprises molybdenum power, a solvent and a binder. A plasticizer may also be employed to control viscosity and pattern formation. The concentration of the various ingredients may vary widely with the proviso that a paste is formed which has a proper viscosity and which may be effectively applied to the greensheet or other surfaces by screening.

Typical solvents for the metal paste include n-butyl carbitol acetate, a terpineol, n-butyl carbinol and the like. The binder includes materials such as ethyl cellulose, polyvinylbutyral and the like. The metal material has a fine particle size generally less than 10 microns on average. Typically, the metal pastes are prepared by adding the ingredients to a mill and mixing the ingredients until a homogenous paste is obtained.

In general, a complete patterning process for greensheets may be described as follows:

A ceramic slurry is prepared by mixing alumina (ceramic) powder, organic binder, plasticizer and solvent at a given mixing ratio in a conventional manner. The slurry is shaped into a tape by means of a tape caster and thereafter the resulting tape is dried and cut into a given length to form a plurality of unsintered soft ceramic sheets or so-called "greensheets".

Via holes are then punched in the sheets and circuit patterns are printed on the surface of each greensheet and in the vias with a metallizing ink or paste using a screen or mask printing process. The metallizing paste, as noted above, is typically a molybdenum paste although other metallic pastes such as tungsten may also be used. The sheets are then dried, stacked, laminated and thereafter sintered to form the MLC substrate.

While the above description was directed to a metallic conductive paste to form conductive lines and to fill vias in greensheets for MLC fabrication, it will be understood by those skilled in the art that there are a number of other coating materials used in the fabrication of MLC electronic components and other electronic components such as printed circuit boards, heatsinks and covers. Exemplary of such coating materials are solder fluxes, solder, photoimageable inks, solder resists, adhesives, lubricants and thermal heat transfer compounds.

The fabrication of electronic components requires a large number of steps as well as the use of a large number of coating materials such as the conductive paste, solder fluxes, etc. mentioned above. Even within a particular class of coating material such as a molybdenum conductive paste, different pastes may be used depending on the properties required for the paste such as density, viscosity, electrical conductivity, etc. If the incorrect printing (coating) material is used and/or an incorrect substrate is used, the integrity of the final electronic component is compromised and the component will most likely be rejected.

With regard to other coating materials used in screening processes, solder and/or solder fluxes may be applied through a mask to a sintered substrate in preparation for a solder bonding operation such as a C-4 operation. Photoimageable inks may also be applied by a screening method to form a pattern on a substrate which can then be developed and metallized to form the desired circuit pattern. Additionally, a solder resist material can be applied to the surface of a substrate through a screening operation to protect the substrate from the high temperatures encountered during a solder reflow process.

Bearing in mind the problems and deficiencies of the prior art, it is therefore an object of the present invention to provide a coating material such as a conductor paste, solder flux, or other such material which material is used in the fabrication of electronic components and which material contains an identifying component which can be identified (measured) to identify the coating material.

A further object of the present invention is to provide a method of identifying a coating material which may be used in any part of the electronic component fabrication process to identify and verify that the proper material was used in the process and, preferably, that it was used on the proper electronic component substrate which is also identifiable.

An additional object of the present invention is to provide an electronic component made using a metallized conductive paste or other coating material of the invention which material is applied to a substrate of an electronic component and which material contains an identifying component which is identifiable so that the integrity of the electronic component can be verified.

It is yet another object of the present invention to provide a process for fabricating an electronic component with at least one of the steps being the use of a coating material which is applied to a substrate of the component such as a greensheet and which material contains an identifying component which can be identified to verify the use of the proper coating material on the proper substrate and, consequently, verify the integrity of the electronic component.

Other objects and advantages of the invention will in part be obvious and will in part be apparent from the specification.

SUMMARY OF THE INVENTION

The above and other objects, which will be apparent to those skilled in the art, are achieved in the present invention which is directed in a first aspect to a coating material which is used in fabricating electronic components by applying the material onto a substrate of the electronic component wherein the coating material comprises a material to be coated and an effective amount of an identifying component which can be identified and which identifying component identifies the coating material used in the fabrication process. The coating material used in the fabricating process may be a metallized paste, a solder flux, solder, photoimageable ink, solder resist and the like. It is preferred that the identifying component be a dye such as an optical dye which color is visible to the eye or a color scanner. A more preferred dye is a UV fluorescent dye which is preferably colorless under visible light and visible under UV light. The UV dye is also preferably color scannable.

In another aspect of the invention, a method of identifying the coating material used in electronic component fabrication comprises the steps of:

applying to a substrate of the electronic component a coating material containing an identifying component which can be identified and which component identifies the coating material used in the fabrication process; and identifying the coating material on the substrate by identifying the identifier component used in the coating material.

In a further aspect of the invention, an electronic component is provided having a coating material thereon wherein the coating material contains an identifying component which component identifies the coating material coated on the substrate of the electronic component.

In yet another aspect of the invention, a process for fabricating an electronic component containing at least one substrate layer comprises the steps of:

applying a coating material to the substrate the coating material comprising a material to be coated and a first identifier component which identifies the coating material applied;

optionally applying a second identifier component or identifying indicia to the substrate layer to identify the substrate layer;

identifying the first identifier component and the second identifier component if employed; and determining the first identifying component and the second identifying component, if any, to identify the coating material and the substrate if a second identifier compound was employed.

A predetermined identifier code may be employed to compare the first identifier compound and/or the second identifier component to verify that the proper coating material and proper substrate was used in the fabrication of the electronic component.

If the substrate is physically or otherwise unique, its identification by inspection may be sufficient. A part number, bar code, etc. may also be used as the second identifier component.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
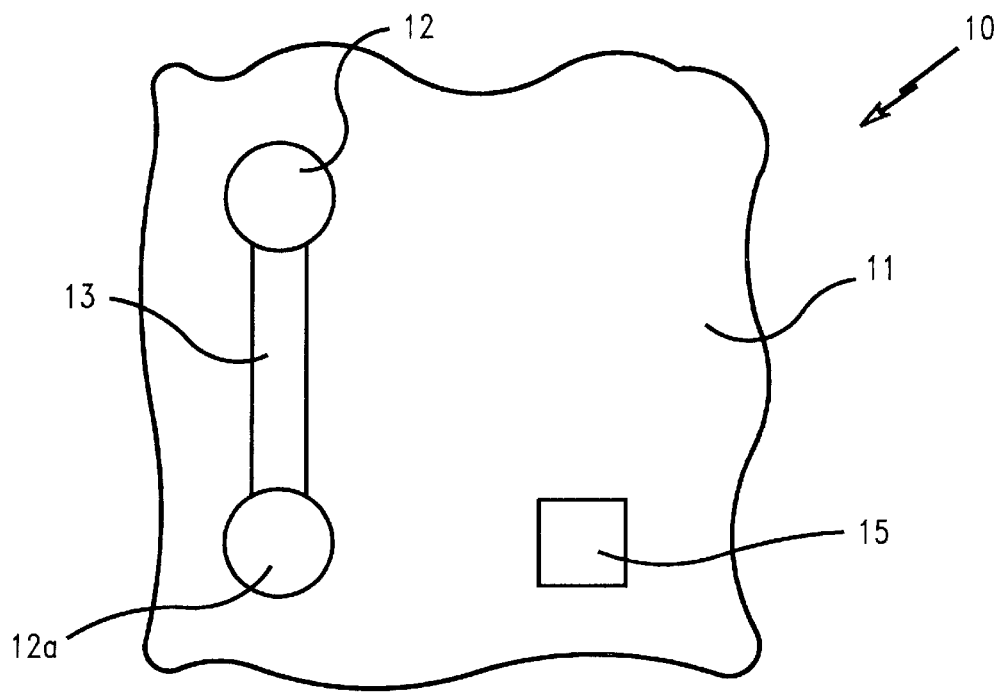
FIG. 1 is a top plan view of part of a dielectric substrate of the invention having thereon metallized pads and a connected conductor line both made with a metallized paste containing a dye and the substrate containing a separate identifier indicia.

In describing the preferred embodiment of the present invention, reference will be made herein to FIGS. 1–2 of the drawings in which like numerals refer to like features of the invention. Features of the invention are not necessarily shown to scale in the drawings.

Basically, the invention is directed to the use of identifier components such as optical dyes or UV visible fluorescent dyes or other such identifier materials in the numerous coating materials used to coat substrates used in the fabrication of electronic components which identifier components indicate and identify the coating material used. For example, the coating materials include solder, solder flux, photoimageable inks, metallized paste, dielectric paste, etc. Using an identifier component in the coating material composition to be coated on a substrate and, preferably the use of an indicator or other identifying indicia also on or incorporated in the substrate, the substrate can be identified as well as the coating material used to coat the substrate. Using both of the above identifying means will increase the product reliability of the fabrication process and lead to enhanced operating efficiencies.

Referring to FIG. 1 the top surface of an electronic component substrate is shown generally as 10. The substrate 11 comprises a dielectric material such as a greensheet having thereon metallized pads 12 and 12a and a connecting metallized conductor line 13. While not obvious from the figures, a metallized paste was used to form the pads 12 and 12a (and vias not shown) and conductor line 13 and the paste contains a dye such as a UV visible fluorescent dye. The dye can be identified by using a UV light source and, for example, a digital color photometer. The digital color photometer will identify the dye color and, consequently, identify the coating material used to form the metallization on the dielectric surface. As will be more fully discussed hereinbelow, for coating materials capable of being colored an optical dye can be used because the dye is not obscured by the color of the coating material. For a solder flux, for example, an optical dye added to the flux may be visibly inspected or preferably identified with a color scanner to determine if the proper coating material or grade of material (solder flux) was used to coat the substrate. A substrate identifier code area 15 is shown which code can be used to identify the substrate 11 and/or the electronic component 10. When a substrate identifier 15 is used in combination with an identifier component in the coating material being applied to the substrate, verification of the substrate 11 and coating material can be enhanced. The substrate identifier 15 can be a bar code, serial number, etc. and may be visible or colorless under visible light. For example, a UV visible fluorescent dye may be used as the substrate identifier.

Figure 2:
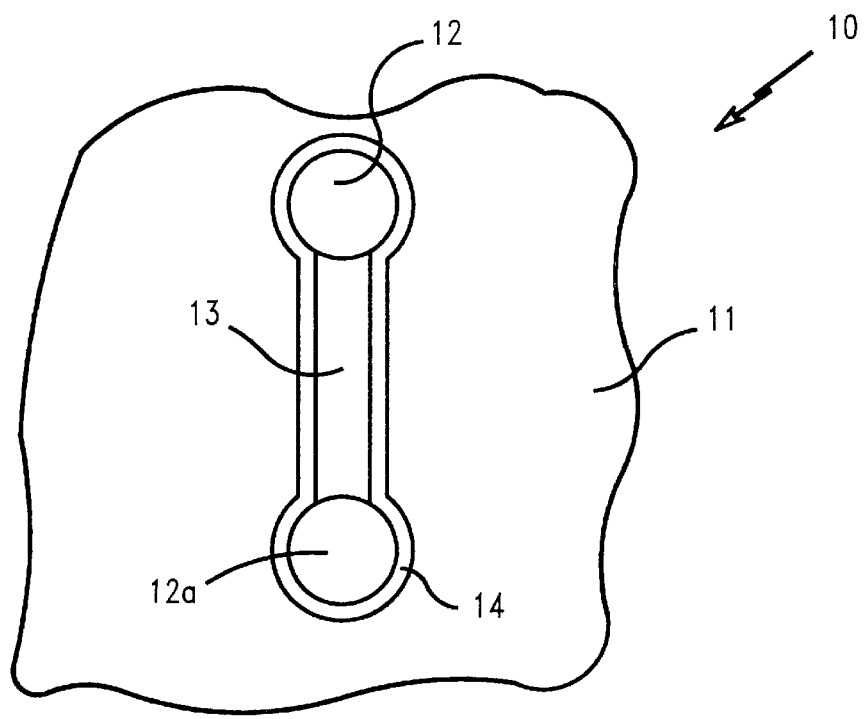
FIG. 2 is top plan view of a dielectric substrate of the invention having metallization thereon in the form of pads and a connected conductor line made with a metallized paste containing a dye with the dye bleeding out to the dielectric area to form a surrounding pattern.

Referring to FIG. 2, an electronic component shown generally as 10 comprises a substrate 11 such as a greensheet. Metallized pads 12 and 12a (and vias not shown) and a metallized connecting conductor line 13 are shown on the surface of the substrate 11. A metallized paste containing a dye was used to form the pattern and the dye is shown bleeding out into or onto the dielectric 11 as shown in dye bleed out region 14. The change in color of the greensheet around the region (periphery) 14 of the conductor line 13 and pads 12 and 12a (bleed out region) can be identified and used to identify the metallized paste used to coat the substrate 11.

One important area where the present invention is used is during the screening of multilayer ceramic (MLC) greensheets or substrates. The use of a mask or template or stencil to control the pattern of a material deposition on a substrate is well known. In general, openings are provided in the sheet of mask material in a pattern which corresponds to the desired pattern to be imparted onto the substrate or structure surface. The mask is placed against the structure surface and deposition of a coating material to selected portions of the substrate through the mask openings are made by applying to the mask surface a coating material to be deposited on the surface of the substrate and forcing the material through the openings. Typical structures on which material depositions are made in a variety of patterns and forms are integrated circuit wafers, greensheets, printed circuit boards and substrates which are used to mount thereon various kinds of electronic devices.

The mask is typically made of a single layer or laminate of material and is conventionally made from a single homogenous metal sheet of copper, stainless steel or molybdenum or alloys thereof. The mask is preferably molybdenum and is generally thin. Other masks may also be employed as well known in the art such as an emulsion mask made by applying a photosensitive resin or ink to a mesh made of synthetic fiber or stainless steel or the like and then removing the unwanted resin portions after an exposure process. For convenience, the following description will be directed to solid metal masks used for thick film screening processes although it will be appreciated by those skilled in the art that the invention could be used for other mask devices and deposition processes where a pattern of coating material is formed on a substrate.

Other substrates that may be employed to form electronic components aside from greensheets, may be printed circuit boards based on epoxy type resins, polyester films, fired ceramics and glasses. As noted above, many different type coating materials such as conductive pastes, solder fluxes, etc. may be applied to the substrates to form patterns thereon.

Regardless of the coating material applied to the substrate to form a pattern, the invention comprises adding an identifier component to the coating material composition which component may be identified to identify the coating material. Preferably, the identifier component will be some form of dye which can be identified either by electronic instruments or simply visually. Many of the coating materials applied to electronic component substrates do not lend themselves to a visual type dye because of the dark color of the coating material to be applied. For these situations, it is preferred to add a dye such as a UV fluorescent dye which is visible under UV light. This type dye will be identified by the use of a UV light source preferably in combination with, for example, a digital color photometer which will identify the dye and, consequently, the coating material in which the dye has been used. It will be appreciated that the identification process can be automated using, for example, a computer, whereby data input from a color scanner or other identifying device is compared in the computer data base with predetermined values and codes and the dye and coating material will be easily identified. Corrective action can be taken if necessary based on the results of the identification process.

When the material is capable of being used with an optical dye an optical dye will typically preferably be used. Even in this case, a color scanner is preferably used with a digital color readout to verify the optical dye and hence the coating material in which the dye was used.

Exemplary commercial dyes which may suitably be employed in the invention include UVF Blue, UVF Green and UVF Yellow sold by FM Group Incorporated, Sloatsburg, NY. The dyes are preferably stable and resistant to the coating material so that no appreciable color change to the dye is effected. The dyes may be added to the coating material composition by conventional means such as mixing, roll milling, etc. to preferably form a homogeneous coating material.

In another aspect of the invention, as shown in FIG. 2, it is contemplated herein that the identifier component used in the coating material to be applied to the substrate bleed out (into/onto) the substrate. The substrate is typically a greensheet and the bleed out region 14 as shown in FIG. 2 may be optically or visually identified to identify the dye and accordingly the coating material in which the dye was used.

In a highly preferred aspect of the invention, the substrate on which the coating material is to be applied and the coating material applied to the substrate both have identifying components or indicia associated therewith. For the substrate, a bar code, serial number or other identifying indicia such as a laser imprinted design may be used to provide a code on the substrate which code can be determined by an identifying device, e.g., bar code reader, and used to verify the substrate. When such a substrate identifier is used in combination with a dye or other identifying component in the coating material applied to the substrate, an enhanced verification procedure is achieved.

While the above description has been directed to the use of dyes in the coating material to be applied to a substrate and the use of identifying indicia such a bar code, serial number or a laser imprinted design on the substrate to identify the substrate, it will appreciated by those skilled in the art that the concept of the invention can be applied to the use of other components for use in the coating material composition or surface indicia which can be used as identifiers. The concept of the invention is to use an identifier such as, for example, an identifier component in metallized paste to identify the metallized paste and to ensure that the proper metallized paste was used to make the desired electronic component. Likewise, the use of a bar code or other identifying means on or associated with a substrate is used to properly verify that the proper substrate was used. Other possible identifier components or identifying indicia for the substrate include serial numbers, stickers, notches, etc.

EXAMPLE

A greensheet comprising a ceramic powder, polyvinyl butyral organic binder and a benzoate plasticizer was used as a substrate. A metallic paste comprising molybdenum, ethylcellulose, a solvent and a yellow UV visible fluorescent dye was screened onto the greensheet through a patterned metal mask such that the openings in the mask allowed the metallic paste to flow through and define a metallization pattern on the surface of the greensheet. The yellow dye was soluble in the solvent of the metal paste and the metal paste was prepared by mixing the ingredients in a conventional three roll milling apparatus.

The mask was then removed and the paste pattern on the greensheet was examined in a darkened environment during exposure to UV light such as that emitted by a "black light" at a wave length of 254 or 365 nm.

The dye diffused into the greensheet area surrounding the paste pattern as shown in FIG. 2. After illumination with UV light, the fluorescent dye which bled into the greensheet provided a very high background contrast to the dark metal containing paste making identification of the paste easily performed. Accordingly, the identity of the metal paste was obtained by measuring the color of the dye which bled into the greensheet. As noted above, in certain situations where there is very little color contrast between the dye used in the metal paste and the metal paste, identification of the metal paste is very difficult. Diffusion of the dye as noted above into the surrounding greensheet substrate region provided a color contrast which enabled identification of the dye and, hence, identification of the metal paste.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An electronic component containing circuitry comprising a substrate and at least one coated material thereon wherein the coated material contains an identifying component which component identifies the coated material.

2. The electronic component of claim 1 wherein the identifying component is an optical dye.

3. The electronic component of claim 1 wherein the identifying component is a UV fluorescent dye.

4. The electronic component of claim 1 wherein the coated material is selected from the group consisting of metallized paste, solder flux, solder, photoimageable ink and solder resist.

5. The electronic component of claim 1 wherein the substrate has incorporated on the surface of the substrate or in the substrate an identifying indicia so that the substrate can be identified as well as the coated material on the electronic component.

6. The electronic component of claim 1 wherein the electronic component is a multilayer ceramic substrate, printed circuit board or heat sink.

7. A greensheet electronic component having metallized pads and metallized conductor lines thereon comprising at least one coated material thereon wherein the coated material contains an identifying component which component identifies the coated material.

8. The greensheet electronic component of claim 7 wherein the identifying component is an optical dye.

9. The greensheet electronic component of claim 7 wherein the identifying component is a UV fluorescent dye.

10. The greensheet electronic component of claim 7 wherein the coated material on the substrate is selected from the group consisting of metallized paste, solder flux, solder, photoimageable ink and solder resist.

11. A multilayer ceramic semiconductor electronic component comprising a plurality of ceramic greensheets stacked and sintered together with the greensheets having via holes and conductive circuit patterns applied to the greensheet, the greensheet having at least one coated material thereon wherein the coated material contains an identifying component which component identifies the coated material.

12. The multilayer ceramic electronic component of claim 11 wherein the coated material is selected from the group consisting of metallized paste, solder flux, solder, photoimageable ink and solder resist.

13. An electronic component containing circuitry comprising a substrate and at least one coated material thereon wherein the coated material contains an identifying component which identifies the coated material, the identifying component leaching out into the substrate so that the area around the coated material may be inspected to identify the coated material on the electronic component.

* * * * *